(12) United States Patent
Chopra et al.

(10) Patent No.: US 6,548,407 B1
(45) Date of Patent: *Apr. 15, 2003

(54) METHOD AND APPARATUS FOR CONTROLLING CHEMICAL INTERACTIONS DURING PLANARIZATION OF MICROELECTRONIC SUBSTRATES

(75) Inventors: Dinesh Chopra, Boise, ID (US); Scott G. Meikle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 110 days.

This patent is subject to a terminal disclaimer.

(21) Appl. No.: 09/655,139

(22) Filed: Aug. 31, 2000

Related U.S. Application Data

(63) Continuation-in-part of application No. 09/558,807, filed on Apr. 26, 2000, now Pat. No. 6,313,038.

(51) Int. Cl.$^7$ .............................................. H01L 21/00
(52) U.S. Cl. ....................... 438/692; 216/38; 216/88; 216/89; 156/345.12; 438/693; 438/745
(58) Field of Search ................................. 438/691, 692, 438/693, 745, 753, 756; 216/38, 88, 89, 91; 156/345 LP

(56) References Cited

U.S. PATENT DOCUMENTS

| | | | |
|---|---|---|---|
| 5,020,283 A | 6/1991 | Tuttle |
| 5,069,002 A | 12/1991 | Sandhu et al. |
| 5,081,796 A | 1/1992 | Schultz |
| 5,177,908 A | 1/1993 | Tuttle |
| 5,209,816 A | 5/1993 | Yu et al. |
| 5,225,034 A | 7/1993 | Yu et al. |
| 5,232,875 A | 8/1993 | Tuttle et al. |

(List continued on next page.)

OTHER PUBLICATIONS

US 6,169,033, 1/2001, Marshall (withdrawn)
Kosmulski, Michal. "About zeta potential." Jul. 18, 1999. http://hermes.umcs.lublin.pl/users/kosmulsk/michal/zetapo.htm (Jun. 7, 2000).
"About Brookhaven Instruments Corporation." http://www-.bic.com/aboutbic.com.htm (Jun. 7, 2000).
"Zeta Potential and Stability." http://www.bic.com/ztheory1.htm (Jun. 7, 2000).
"When Zeta Potential is Important." http://www.bic.com/morezeta.htm (Jun. 7, 2000).
"Characterising and Controlling High Solid Suspensions Using Zeta Potential." http://www.ceram.co.uk/ptp/1996_Projects/jmichaelp.htm (Jun. 7, 2000).
"An introduction to zeta potential." http://reliant.pharm.nottingham.ac.uk/zeta.html (Jun. 7, 2000).

(List continued on next page.)

Primary Examiner—William A. Powell
(74) Attorney, Agent, or Firm—Perkins Coie LLP

(57) ABSTRACT

A method and apparatus for planarizing a microelectronic substrate. In one embodiment, the microelectronic substrate is engaged with a planarizing medium that includes a planarizing pad and a planarizing liquid. The planarizing liquid has a selected pH and abrasive elements in the planarizing pad have an isoelectric point that is at or below the pH of the planarizing liquid. For example, the abrasive elements can include coated or conglomerate elements formed from two materials, each having a different isoelectric point. Alternatively, different abrasive elements in the planarizing pad can have different isoelectric points. Accordingly, the abrasive elements can have a reduced affinity for components of the planaring liquid, such as corrosion-inhibiting agents. In another embodiment, high-frequency radiation, such as ultraviolet radiation, is directed toward the planarizing medium to control an amount of the corrosion-inhibiting agent adsorbed to the abrasive elements.

84 Claims, 4 Drawing Sheets

U.S. PATENT DOCUMENTS

| | | |
|---|---|---|
| 5,234,867 A | 8/1993 | Schultz et al. |
| 5,240,552 A | 8/1993 | Yu et al. |
| 5,244,534 A | 9/1993 | Yu et al. |
| 5,245,790 A | 9/1993 | Jerbic |
| 5,245,796 A | 9/1993 | Miller et al. |
| RE34,425 E | 11/1993 | Schultz |
| 5,297,364 A | 3/1994 | Tuttle |
| 5,354,490 A | 10/1994 | Yu et al. |
| 5,421,769 A | 6/1995 | Schultz et al. |
| 5,433,651 A | 7/1995 | Lustig et al. |
| 5,449,314 A | 9/1995 | Meikle et al. |
| 5,486,129 A | 1/1996 | Sandhu et al. |
| 5,514,245 A | 5/1996 | Doan et al. |
| 5,533,924 A | 7/1996 | Stroupe et al. |
| 5,540,810 A | 7/1996 | Sandhu et al. |
| 5,609,718 A | 3/1997 | Meikle |
| 5,614,444 A | 3/1997 | Farkas et al. |
| 5,618,381 A | 4/1997 | Doan et al. |
| 5,618,447 A | 4/1997 | Sandhu |
| 5,624,303 A | 4/1997 | Robinson |
| 5,643,060 A | 7/1997 | Sandhu et al. |
| 5,658,183 A | 8/1997 | Sandhu et al. |
| 5,658,190 A | 8/1997 | Wright et al. |
| 5,664,988 A | 9/1997 | Stroupe et al. |
| 5,679,065 A | 10/1997 | Henderson |
| 5,690,540 A | 11/1997 | Elliott et al. |
| 5,700,180 A | 12/1997 | Sandhu et al. |
| 5,702,292 A | 12/1997 | Brunelli et al. |
| 5,730,642 A | 3/1998 | Sandhu et al. |
| 5,733,176 A | 3/1998 | Robinson et al. |
| 5,736,427 A | 4/1998 | Henderson |
| 5,738,567 A | 4/1998 | Manzonie et al. |
| 5,747,386 A | 5/1998 | Moore |
| 5,792,709 A | 8/1998 | Robinson et al. |
| 5,795,218 A | 8/1998 | Doan et al. |
| 5,795,495 A | 8/1998 | Meikle |
| 5,807,165 A | 9/1998 | Uzoh et al. |
| 5,823,855 A | 10/1998 | Robinson |
| 5,827,781 A | 10/1998 | Skrovan et al. |
| 5,830,806 A | 11/1998 | Hudson et al. |
| 5,842,909 A | 12/1998 | Sandhu et al. |
| 5,851,135 A | 12/1998 | Sandhu et al. |
| 5,868,896 A | 2/1999 | Robinson et al. |
| 5,871,392 A | 2/1999 | Meikle et al. |
| 5,876,266 A | 3/1999 | Miller et al. |
| 5,879,222 A | 3/1999 | Robinson |
| 5,882,248 A | 3/1999 | Wright et al. |
| 5,893,754 A | 4/1999 | Robinson et al. |
| 5,895,550 A | 4/1999 | Andreas |
| 5,910,043 A | 6/1999 | Manzonie et al. |
| 5,916,819 A | 6/1999 | Skrovan et al. |
| 5,919,082 A | 7/1999 | Walker et al. |
| 5,930,699 A | 7/1999 | Bhatia |
| 5,934,980 A | 8/1999 | Koos et al. |
| 5,938,801 A | 8/1999 | Robinson |
| 5,945,347 A | 8/1999 | Wright |
| 5,954,912 A | 9/1999 | Moore |
| 5,967,030 A | 10/1999 | Blalock |
| 5,972,792 A | 10/1999 | Hudson |
| 5,976,000 A | 11/1999 | Hudson |
| 5,980,363 A | 11/1999 | Meikle et al. |
| 5,981,396 A | 11/1999 | Robinson et al. |
| 5,989,470 A | 11/1999 | Doan et al. |
| 5,990,012 A | 11/1999 | Robinson et al. |
| 5,994,224 A | 11/1999 | Sandhu et al. |
| 5,997,384 A | 12/1999 | Blalock |
| 6,036,586 A | 3/2000 | Ward |
| 6,039,633 A | 3/2000 | Chopra |
| 6,040,245 A | 3/2000 | Sandhu et al. |
| 6,054,015 A | 4/2000 | Brunelli et al. |
| 6,060,395 A | 5/2000 | Skrovan et al. |
| 6,062,958 A | 5/2000 | Wright et al. |
| 6,066,030 A | 5/2000 | Uzoh |
| 6,074,286 A | 6/2000 | Ball |
| 6,077,785 A | 6/2000 | Andreas |
| 6,083,085 A | 7/2000 | Lankford |
| 6,090,475 A | 7/2000 | Robinson et al. |
| 6,110,820 A | 8/2000 | Sandhu et al. |
| 6,116,988 A | 9/2000 | Ball |
| 6,120,354 A | 9/2000 | Koos et al. |
| 6,124,207 A | 9/2000 | Robinson et al. |
| 6,135,856 A | 10/2000 | Tjaden et al. |
| 6,136,043 A | 10/2000 | Robinson et al. |
| 6,136,218 A | 10/2000 | Skrovan et al. |
| 6,139,402 A | 10/2000 | Moore |
| 6,143,123 A | 11/2000 | Robinson et al. |
| 6,143,155 A | 11/2000 | Adams et al. |
| 6,152,808 A | 11/2000 | Moore |
| 6,176,763 B1 | 1/2001 | Kramer et al. |
| 6,176,992 B1 | 1/2001 | Talieh |
| 6,180,525 B1 | 1/2001 | Morgan |
| 6,186,870 B1 | 2/2001 | Wright et al. |
| 6,187,681 B1 | 2/2001 | Moore |
| 6,191,037 B1 | 2/2001 | Robinson et al. |
| 6,193,588 B1 | 2/2001 | Carlson et al. |
| 6,196,899 B1 | 3/2001 | Chopra et al. |
| 6,200,901 B1 | 3/2001 | Hudson et al. |
| 6,203,404 B1 | 3/2001 | Joslyn et al. |
| 6,203,407 B1 | 3/2001 | Robinson |
| 6,203,413 B1 | 3/2001 | Skrovan |
| 6,206,754 B1 | 3/2001 | Moore |
| 6,206,756 B1 | 3/2001 | Chopra et al. |
| 6,206,757 B1 | 3/2001 | Custer et al. |
| 6,206,759 B1 | 3/2001 | Agarwal et al. |
| 6,210,257 B1 | 4/2001 | Carlson |
| 6,213,845 B1 | 4/2001 | Elledge |
| 6,218,316 B1 | 4/2001 | Marsh |
| 6,220,934 B1 | 4/2001 | Sharples et al. |
| 6,375,548 B1 | 4/2001 | Andreas |
| 6,224,466 B1 | 5/2001 | Walker et al. |
| 6,227,955 B1 | 5/2001 | Custer et al. |
| 6,234,874 B1 | 5/2001 | Ball |
| 6,234,877 B1 | 5/2001 | Koos et al. |
| 6,234,878 B1 | 5/2001 | Moore |
| 6,237,483 B1 | 5/2001 | Blalock |
| 6,244,944 B1 | 6/2001 | Elledge |
| 6,250,994 B1 | 6/2001 | Chopra et al. |
| 6,251,785 B1 | 6/2001 | Wright |
| 6,254,460 B1 | 7/2001 | Walker et al. |
| 6,261,151 B1 | 7/2001 | Sandhu et al. |
| 6,261,163 B1 | 7/2001 | Walker et al. |
| 6,267,650 B1 | 7/2001 | Hembree |
| 6,271,139 B1 | 8/2001 | Alwan et al. |
| 6,273,786 B1 | 8/2001 | Chopra et al. |
| 6,273,796 B1 | 8/2001 | Moore |
| 6,273,800 B1 | 8/2001 | Walker et al. |
| 6,276,996 B1 | 8/2001 | Chopra |
| 6,277,015 B1 | 8/2001 | Robinson |
| 6,284,660 B1 | 9/2001 | Doan |
| 6,290,579 B1 | 9/2001 | Walker et al. |
| 6,296,557 B1 | 10/2001 | Walker |
| 6,306,012 B1 | 10/2001 | Sabde |
| 6,306,014 B1 | 10/2001 | Walker et al. |
| 6,306,768 B1 | 10/2001 | Klein |
| 6,309,282 B1 | 10/2001 | Wright et al. |
| 6,312,486 B1 | 11/2001 | Sandhu et al. |
| 6,312,558 B2 | 11/2001 | Moore |
| 6,313,038 B1 * | 11/2001 | Chopra et al. ............... 438/692 |
| 6,325,702 B2 | 12/2001 | Robinson |
| 6,328,632 B1 | 12/2001 | Chopra |
| 6,331,135 B1 | 12/2001 | Sabde |

| | | |
|---|---|---|
| 6,331,139 B2 | 12/2001 | Walker et al. |
| 6,331,488 B1 | 12/2001 | Doan et al. |
| 6,338,667 B2 | 1/2002 | Sandhu et al. |
| 6,350,180 B2 | 2/2002 | Southwick |
| 6,350,691 B1 | 2/2002 | Lankford |
| 6,352,466 B1 | 3/2002 | Moore |
| 6,354,917 B1 | 3/2002 | Ball |
| 6,354,919 B2 | 3/2002 | Chopra |
| 6,354,923 B1 | 3/2002 | Lankford |
| 6,354,930 B1 | 3/2002 | Moore |
| 6,358,122 B1 | 3/2002 | Sabde et al. |
| 6,358,127 B1 | 3/2002 | Carlson et al. |
| 6,358,129 B2 | 3/2002 | Dow |
| 6,361,400 B2 | 3/2002 | Southwick |
| 6,361,417 B2 | 3/2002 | Walker et al. |
| 6,361,832 B1 | 3/2002 | Agarwal et al. |
| 6,364,749 B1 | 4/2002 | Walker |
| 6,364,757 B2 | 4/2002 | Moore |
| 6,368,190 B1 | 4/2002 | Easter et al. |
| 6,368,193 B1 | 4/2002 | Carlson et al. |
| 6,368,194 B1 | 4/2002 | Sharples et al. |
| 6,368,197 B2 | 4/2002 | Elledge |
| 6,376,381 B1 | 4/2002 | Sabde |

OTHER PUBLICATIONS

"Why are interfaces charged?" http://reliant.pharm.nottingham.ac.uk/charge.html (Jun. 6, 2000).
"Zeta potential and electrolytes." http://reliant.pharm.nottingham.ac.uk/elect.html (Jun. 7, 2000).
"Measurement of Zeta Potential." http://reliant.pharm.nottingham.ac.uk/meas.html (Jun. 7, 2000).
"Planning your zeta potential experiment." http://reliant.pharm.nottingham.ac.uk/plan.html (Jun. 7, 2000).
"Operating procedure for the Zetasizer." http://reliant.pharm.nottingham.ac.uk/use.html (Jun. 7, 2000).
PCT International Search Report for International Application No. PCT/US01/13776, Feb. 12, 2002, (5 pages).
Kondo, S. et al., "Abrasive–Free Polishing for Copper Damascene Interconnection", *Journal of the Electrochemical Society*, 147 (10) 3907–3913 (2000).

* cited by examiner

METHOD AND APPARATUS FOR CONTROLLING CHEMICAL INTERACTIONS DURING PLANARIZATION OF MICROELECTRONIC SUBSTRATES

CROSS-REFERENCE TO RELATED APPLICATION

This application is a continuation-in-part of U.S. patent application Ser. No. 09/558,807, filed Apr. 26, 2000, now U.S. Pat. No. 6,313,038.

TECHNICAL FIELD

This invention relates to methods and apparatuses for controlling chemical interactions during planarization of microelectronic substrates, for example, controlling the interactions of a corrosion-inhibiting agent.

BACKGROUND

Mechanical and chemical-mechanical planarization processes (collectively "CMP") are used in the manufacturing of electronic devices for forming a flat surface on semiconductor wafers, field emission displays and many other microelectronic-device substrate assemblies. CMP processes generally remove material from a substrate assembly to create a highly planar surface at a precise elevation in the layers of material on the substrate assembly. FIG. 1 schematically illustrates an existing web-format planarizing machine 10 for planarizing a substrate 12. The planarizing machine 10 has a support table 14 with a top-panel 16 at a workstation where an operative portion "A" of a planarizing pad 40 is positioned. The top-panel 16 is generally a rigid plate to provide a flat, solid surface to which a particular section of the planarizing pad 40 may be secured during planarization.

The planarizing machine 10 also has a plurality of rollers to guide, position and hold the planarizing pad 40 over the top-panel 16. The rollers include a supply roller 20, first and second idler rollers 21a and 21b, first and second guide rollers 22a and 22b, and take-up roller 23. The supply roller 20 carries an unused or pre-operative portion of the planarizing pad 40, and the take-up roller 23 carries a used or post-operative portion of the planarizing pad 40. Additionally, the first idler roller 21a and the first guide roller 22a stretch the planarizing pad 40 over the top-panel 16 to hold the planarizing pad 40 stationary during operation. A motor (not shown) drives at least one of the supply roller 20 and the take-up roller 23 to sequentially advance the planarizing pad 40 across the top-panel 16. Accordingly, clean pre-operative sections of the planarizing pad 40 may be quickly substituted for used sections to provide a consistent surface for planarizing and/or cleaning the substrate 12.

The web-format planarizing machine 10 also has a carrier assembly 30 that controls and protects the substrate 12 during planarization. The carrier assembly 30 generally has a substrate holder 32 to pick up, hold and release the substrate 12 at appropriate stages of the planarizing process. Several nozzles 33 attached to the substrate holder 32 dispense a planarizing solution 44 onto a planarizing surface 42 of the planarizing pad 40. The carrier assembly 30 also generally has a support gantry 34 carrying a drive assembly 35 that can translate along the gantry 34. The drive assembly 35 generally has an actuator 36, a drive shaft 37 coupled to the actuator 36, and an arm 38 projecting from the drive shaft 37. The arm 38 carries the substrate holder 32 via a terminal shaft 39 such that the drive assembly 35 orbits the substrate holder 32 about an axis B—B (as indicated by arrow "$R_1$"). The terminal shaft 39 may also rotate the substrate holder 32 about its central axis C—C (as indicated by arrow "$R_2$").

The planarizing pad 40 and the planarizing solution 44 define a planarizing medium that mechanically and/or chemically-mechanically removes material from the surface of the substrate 12. The planarizing pad 40 used in the web-format planarizing machine 10 is typically a fixed-abrasive planarizing pad in which abrasive particles are fixedly bonded to a suspension material. In fixed-abrasive applications, the planarizing solution is a "clean solution" without abrasive particles because the abrasive particles are fixedly distributed across the planarizing surface 42 of the planarizing pad 40. In other applications, the planarizing pad 40 may be a non-abrasive pad without abrasive particles. The planarizing solutions 44 used with the non-abrasive planarizing pads are typically CMP slurries with abrasive particles and chemicals to remove material from a substrate.

To planarize the substrate 12 with the planarizing machine 10, the carrier assembly 30 presses the substrate 12 against the planarizing surface 42 of the planarizing pad 40 in the presence of the planarizing solution 44. The drive assembly 35 then orbits the substrate holder 32 about the axis B—B and optionally rotates the substrate holder 32 about the axis C—C to translate the substrate 12 across the planarizing surface 42. As a result, the abrasive particles and/or the chemicals in the planarizing medium remove material from the surface of the substrate 12.

The CMP processes should consistently and accurately produce a uniformly planar surface on the substrate assembly to enable precise fabrication of circuits and photo-patterns. During the fabrication of transistors, contacts, interconnects and other features, many substrate assemblies develop large "step heights" that create a highly topographic surface across the substrate assembly. Yet, as the density of integrated circuits increases, it is necessary to have a planar substrate surface at several intermediate stages during substrate assembly processing because non-uniform substrate surfaces significantly increase the difficulty of forming sub-micron features. For example, it is difficult to accurately focus photo patterns to within tolerances approaching 0.1 micron on non-uniform substrate surfaces because sub-micron photolithographic equipment generally has a very limited depth of field. Thus, CMP processes are often used to transform a topographical substrate surface into a highly uniform, planar substrate surface.

In some conventional CMP processes, the planarizing pad 40 engages a metal portion of the substrate 12 having a highly topographical surface with high regions and low regions. The planarizing liquid 44 can include solvents or other agents that chemically oxidize and/or etch the metal to increase the removal rate of the metal during planarization. During the planarizing process, the beneficial accelerating effect of the etchant can be reduced because the etchant can act at least as quickly on the low regions of the metal portion as the high regions of the metal portion. Accordingly, the low regions may recede from the high regions and reduce the planarity of the substrate 12.

One approach addressing this potential drawback is to dispose a corrosion-inhibiting agent in the planarizing liquid 44 to restrict or halt the action of the etchant. This allows the mechanical interaction between the planarizing pad 40 and the substrate 12 to dominate the chemical interaction. Accordingly, the removal rate at the high regions of the microelectronic substrate 12 is generally higher than the low regions because the high regions have more mechanical contact with the planarizing pad 40 than do the low regions. As a result, the height differences between the high regions and the low regions are more quickly reduced. The inhibiting agent, however, can have adverse effects on the overall removal rate and other aspects of the planarizing process.

SUMMARY OF THE INVENTION

The present invention is directed toward methods and apparatuses for planarizing microelectronic substrates. A method in accordance with one aspect of the invention includes engaging the microelectronic substrate with a planarizing medium that includes a planarizing liquid and a planarizing pad having a planarizing surface and abrasive elements fixedly positioned at least proximate to the planarizing surface. The method further includes controlling an isoelectric point of at least a portion of the planarizing pad to be approximately equal to or less than a pH of the planarizing liquid, and moving at least one of the planarizing pad and the microelectronic substrate relative to the other to remove material from the microelectronic substrate.

In a further aspect of the invention, the isoelectric point of the planarizing pad can be controlled by controlling the isoelectric point of the abrasive elements in the planarizing pad. For example, the abrasive elements can be selected to include two constituents which, when combined, produce an abrasive element having the desired isoelectric point. Alternatively, different abrasive elements, each having a different isoelectric point, can be disposed in close proximity to each other in the planarizing pad to produce the desired aggregate isoelectric point.

In another aspect of the invention, the method can include engaging the microelectronic substrate with a planarizing medium that includes a planarizing pad having abrasive elements fixedly dispersed therein, and a planarizing liquid disposed on the planarizing pad. The planarizing liquid has a passivating agent, such as a corrosion-inhibiting agent. At least one of the planarizing pad and the microelectronic substrate is moved relative to the other to remove material from the microelectronic substrate. The method further includes controlling an amount of the passivating agent adsorbed to the abrasive elements by directing electromagnetic radiation toward the planarizing medium. The electromagnetic radiation can include ultraviolet radiation having a wavelength of from about 100 nanometers to about 350 nanometers, and the radiation can be directed toward the planarizing medium from a source spaced apart from the planarizing medium and/or from a carrier that supports the microelectronic substrate relative to the planarizing medium.

Another aspect of the invention is directed to an apparatus for removing material from a microelectronic substrate. In a further aspect of the invention, the apparatus can include a platen having a generally flat support surface, a planarizing pad supported on the platen and having a planarizing surface configured to support a planarizing liquid, and a carrier configured to engage a microelectronic substrate and support the microelectronic substrate adjacent to the planarizing pad, with at least one of the platen and the carrier being movable relative to the other. A plurality of abrasive elements are fixedly positioned in the planarizing pad at least proximate to the planarizing surface and have an aggregate isoelectric point selected to be less than a pH of the planarizing liquid. The abrasive elements can include a first constituent having a first isoelectric point and a second constituent having a second isoelectric point different than the first isoelectric point. For example, the second constituent can at least partially coat the first constituent. Alternatively, the abrasive elements can include first abrasive elements having a first isoelectric point and second abrasive elements having a second isoelectric point different than the first isoelectric point. The apparatus can still further include a source of high frequency electromagnetic radiation (such as ultraviolet radiation) directed toward the planarizing pad. The electromagnetic radiation source can be attached to the carrier or spaced apart from the planarizing medium.

DETAILED DESCRIPTION

The present disclosure describes planarizing media and methods for using planarizing media for chemical and/or chemical-mechanical planarizing of substrates and substrate assemblies used in the fabrication of microelectronic devices. Many specific details of certain embodiments of the invention are set forth in the following description and in FIGS. 2–6 to provide a thorough understanding of these embodiments. One skilled in the art, however, will understand that the present invention may have additional embodiments, or that the invention may be practiced without several of the details described below.

Figure 1:
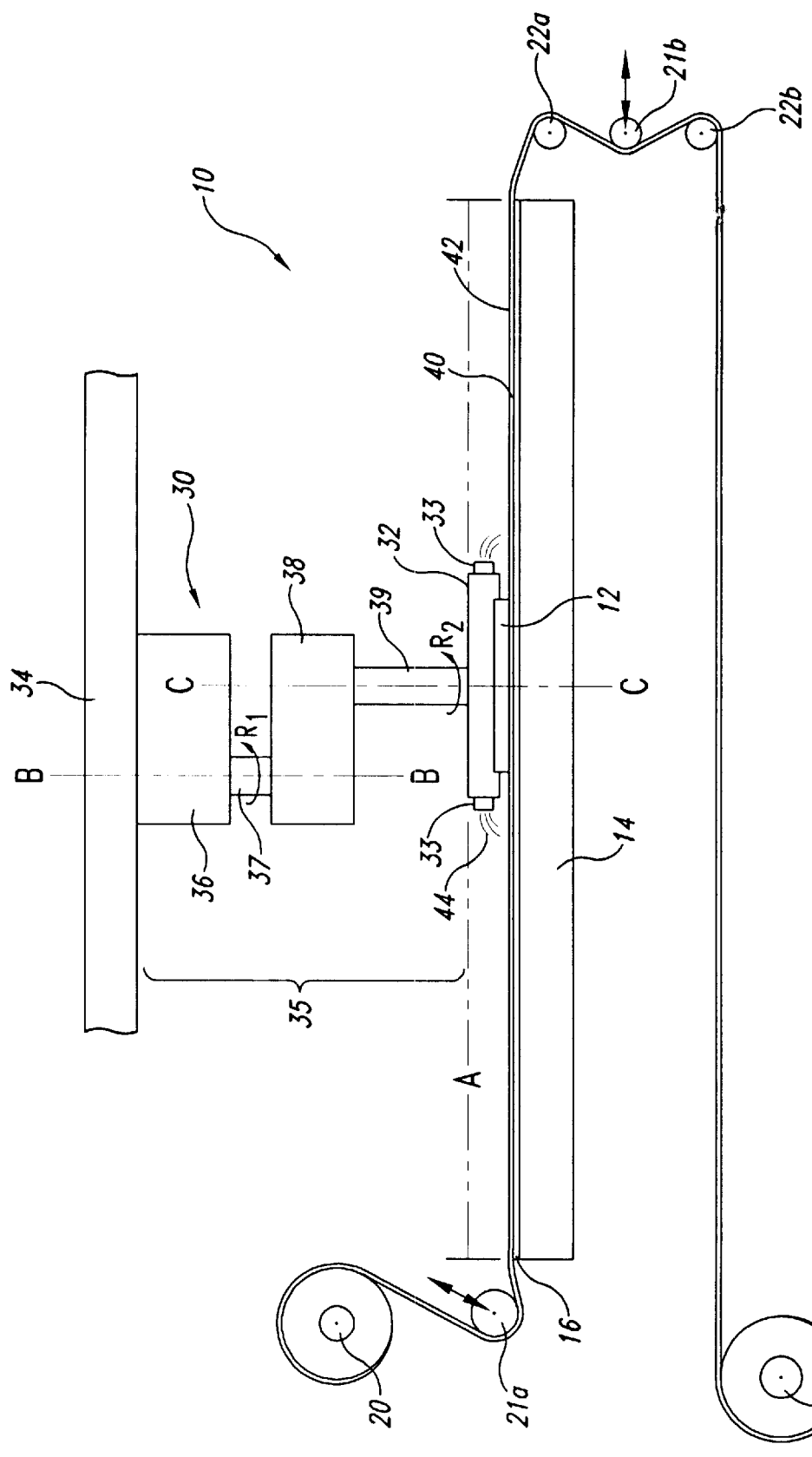
FIG. 1 is a partially schematic side elevational view of a planarizing apparatus in accordance with the prior art.
Figure 2:
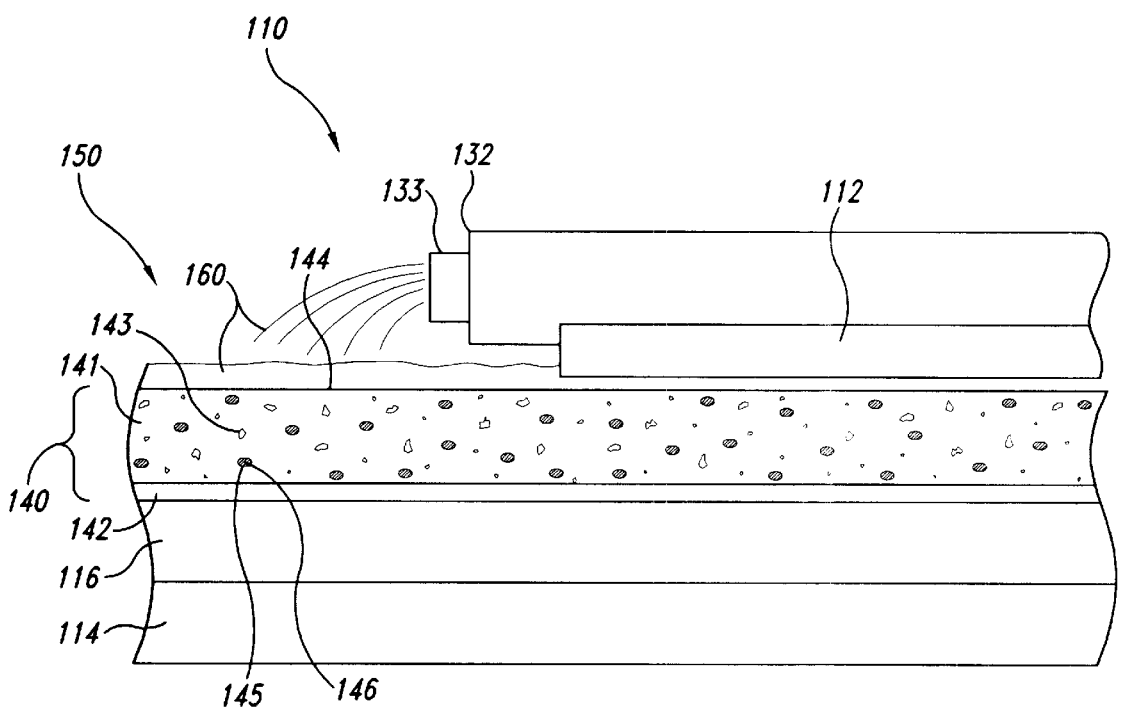
FIG. 2 is a schematic side cross-sectional view partially illustrating a planarizing pad having embedded abrasive elements and an embedded reactive chemical agent in accordance with an embodiment of the invention.

FIG. 2 is a schematic side elevational view illustrating a portion of a CMP machine 110 having a planarizing medium 150 in accordance with an embodiment of the invention. The planarizing medium 150 can include a planarizing pad 140 and a planarizing liquid 160 disposed on the planarizing pad 140. The planarizing machine 110 includes a support table 114 and a top-panel 116 that support the planarizing medium 150 in a manner generally similar to that discussed above with reference to FIG. 1. The planarizing machine 110 further includes a substrate holder or carrier 132 that supports a microelectronic substrate 112, also in a manner generally similar to that discussed above with reference to FIG. 1. As used herein, the term microelectronic substrate refers to a microelectronic substrate material with or without an assembly of microelectronic devices or features.

In one embodiment, the planarizing liquid 160 is dispensed onto the planarizing pad 140 from a port 133 in the substrate holder 132. Alternatively, the planarizing liquid 160 can be directed to the planarizing pad 140 from other sources, such as a conduit (not shown) positioned near the planarizing pad 140. In either embodiment, the planarizing liquid 160 can include one or more chemicals that control the manner and rate by which material is removed from the microelectronic substrate 112 during planarization. For example, the planarizing liquid 160 can include an etchant for etching the microelectronic substrate 112 and/or a passivating agent, such as a corrosion-inhibiting agent to prevent or restrict corrosion or etching during selected phases of the planarization process. In one aspect of this embodiment, the microelectronic substrate 112 can include a copper layer or copper components, and the planarizing liquid 160 can include benzoltriazole to inhibit etching of the copper at selected phases of the CMP process. The benzoltriazole can be in the form of solid particles suspended in the planarizing liquid 160. Alternatively, the planarizing liquid 160 and/or the planarizing pad 140 can include other chemicals that inhibit chemical interaction between the planarizing medium 150 and the microelectronic substrate 112.

The planarizing pad 140 can include a pad body or suspension medium 141 and a backing layer 142 that supports the pad body 141. The pad body 141 can include polycarbonates, resins, acrylics, polymers (such as polyurethane) or other suitable materials. In one embodiment, a plurality of abrasive elements 143 are distributed in the planarizing pad body 141 proximate to a planarizing surface 144 of the planarizing pad 140. As the planarizing pad 140 wears down during planarization, new abrasive elements 143 are exposed at the planarizing surface 144 to maintain or control the abrasive characteristics of the planarizing pad 140 throughout the planarization process. The abrasive elements 143 can include alumina, ceria, titania or other suitable abrasive materials that mechanically and/or chemically-mechanically remove material from the microelectronic substrate 112.

During planarization, the performance of the abrasive elements 143 can be impaired by the chemicals in the planarizing solution. For example, benzoltriazole or other inhibiting agents can attach to the surfaces of the abrasive elements 143 and reduce the chemical and/or mechanical interactions between the abrasive elements 143 and the microelectronic substrate 112. Accordingly, in one embodiment, the planarizing medium 150 includes a chemical agent 146 that reduces or eliminates the effect of inhibiting agents on the abrasive elements 143. In one aspect of this embodiment, the chemical agent 146 is embedded in the planarizing pad body 141 and is released into the planarizing liquid 160 as the planarizing pad 140 wears down. In another aspect of this embodiment, the chemical agent 146 is selected to undergo a chemical reaction with the planarizing liquid 160 or a constituent of the planarizing liquid 160 to form an altered chemical agent. The altered chemical agent then slows or halts the extent to which the inhibiting agent restricts the chemical and/or mechanical interaction between the abrasive elements 143 and the microelectronic substrate 112. For example, the chemical agent 146 can be selected to form a solvent or etchant that removes the inhibiting agent from the abrasive elements 143 and/or prevents the inhibiting agent from attaching, coupling and/or chemically interacting with the abrasive elements 143.

In one embodiment, the chemical agent 146 can include phosphorus, chlorine, nitrogen, sulfur or compounds that include these elements. Accordingly, the chemical agent can form an altered chemical agent that includes phosphoric acid, hydrochloric acid, nitric acid, or sulfuric acid, respectively, upon chemically reacting with the planarizing liquid 160. Alternatively, the chemical agent 146 can include other compounds or elements that react with the planarizing liquid 160 to form other chemicals that restrict or prevent interaction between the abrasive elements 143 and inhibiting agents.

In one aspect of the foregoing embodiments, the altered chemical agent can dissolve the inhibiting agent. Alternatively, the altered chemical agent can react with the inhibiting agent to form a compound that is more soluble in the planarizing liquid 160 than is the inhibiting agent alone. Accordingly, the inhibiting agent will be more likely to dissolve in the planarizing liquid 160. In another alternate embodiment, the altered chemical agent can break down the inhibiting agent into constituents that are more soluble in the planarizing liquid 160 than is the inhibiting agent alone. In still further embodiments, the altered chemical agent can undergo other reactions or interactions with the inhibiting agent that at least restrict the chemical interaction between the inhibiting agent and the abrasive elements 143.

In another embodiment, the chemical agent 146 can react directly with the inhibiting agent without first reacting with the planarizing liquid 160. For example, the chemical agent 146 can include solvents, such as the acidic compounds discussed above, or other suitable compounds that dissolve the inhibiting agent or otherwise limit the ability of the inhibiting agent to impair the effectiveness of the abrasive elements 143.

Whether the chemical agent 146 reacts directly with the inhibiting agent or first reacts with the planarizing liquid 160 to form an altered chemical agent that reacts with the inhibiting agent, the chemical agent 146 can be embedded in the planarizing pad body 141. In one embodiment, solid granules of the chemical agent 146 are dispersed in a liquid or soft planarizing pad material, and then the planarizing pad material is cured to solidify around the chemical agent 146 and form discrete cells 145 around the chemical agent 146. For example, the chemical agent 146 can be distributed in the planarizing pad body 141 in a manner generally similar to that with which the abrasive elements 143 are distributed. Alternatively, the discrete cells 145 can be preformed in the planarizing pad body 141 and then filled with the chemical agent 146. In this alternate embodiment, the chemical agent 146 can be in a liquid, gel, or solid phase. In either of the above methods for distributing the chemical agent 146 in the planarizing body 141, the size, shape and distribution of the cells 145 within the planarizing pad body 141 can be selected to reduce the impact of the chemical agent 146 on the abrasive characteristics of the planarizing pad body. For example, the cells 145 can be small and uniformly distributed in the planarizing pad body 141 so as not to interfere with the distribution and/or operation of the abrasive elements 143. In one aspect of this embodiment, the cells 145 are randomly distributed and are from about 50% to about 100% the size of the abrasive elements 143. Alternatively, the cells 145 can be larger or smaller, so long as they do not interfere with the abrasive elements 143. The cells 145 can have a generally elliptical shape in one embodiment and can have other shapes in other embodiments.

In an embodiment in accordance with another aspect of the invention, the pH of the planarizing liquid 160 can be controlled to selected levels that are believed to reduce the chemical interaction between the inhibiting agent and the abrasive elements 143. For example, in one aspect of this embodiment, the abrasive elements 143 have a first zeta potential and the microelectronic substrate 112 includes a metal or other constituent having a second zeta potential. As used herein, the zeta potential refers to the potential of a surface or region proximate to a surface in a particular planarizing medium. For example, when the planarizing liquid 160 includes an inhibiting agent, the agent is typically includes negatively charged ions. Accordingly, the pH of the planarizing fluid 160 can be selected so that the abrasive elements 143 have a zeta potential similar (i.e., of the same polarity) to that of the inhibiting agent so that they repel. This can prevent chemical interaction between the inhibiting agent and the planarizing pad 140. In one aspect of this embodiment, for example, when the abrasive elements 143 include alumina and the microelectronic substrate 112 includes copper, the planarizing liquid 160 has a pH from about 6 to about 10. In a particular aspect of this embodiment, the planarizing liquid 160 has a pH of about 7 and in other embodiments, the planarizing liquid has a pH of other values.

One feature of an embodiment of the planarizing medium 150 discussed above with reference to FIG. 2 is that the planarizing pad 140 includes a chemical agent 146 that at least limits the chemical interaction between the inhibiting agent in the planarizing liquid 160 and the abrasive elements 143 in the planarizing pad 140. The chemical agent 146 may also limit, to a lesser degree, the interaction between the inhibiting agent and the microelectronic substrate 112, but the primary effect of the chemical agent 146 is generally to limit the chemical interaction between the inhibiting agent and the abrasive elements 143. An advantage of this feature is that the surfaces of the abrasive elements 143 can remain chemically active to planarize the microelectronic substrate 112. This is unlike some conventional techniques for which the inhibiting agent can restrict the effectiveness of the abrasive elements 143.

Another advantage of an embodiment of the planarizing medium 150 is that the chemical agent 146 remains embedded in the planarizing pad 140 until the planarizing pad 140 wears down sufficiently to release the chemical agent 146. Accordingly, the amount of the chemical agent 146 released into the planarizing liquid 160 can be controlled by controlling the concentration and the distribution of the chemical agent 146 in the planarizing pad 140 and the rate with which the planarizing pad 140 abrades during planarization.

In another embodiment, the chemical agent 146 (released as the planarizing pad 140 abrades during planarization) interacts with the planarizing liquid 160 to form compounds that control other aspects of the planarizing process. For example, the chemical agent 146 can react with the planarizing liquid 160 to form a solvent or etchant that removes material from the microelectronic substrate 112. In one aspect of this embodiment, the chemical agent 146 can include nitrogen or a nitrogen compound (such as potassium nitrate) that forms nitric acid when exposed to the planarizing liquid 160. The nitric acid can directly etch copper or other metals from the microelectronic substrate 112, to increase the planarizing rate of the microelectronic substrate when the metals are exposed. In other embodiments, the chemical agent 146 can react with the planarizing liquid 160 to form other chemical compounds. For example, the chemical agent 146 can form a surfactant that increases the wetted surface area of the planarizing pad 140 and/or the microelectronic substrate 112 to increase the speed and uniformity of the planarizing process. In still further embodiments, the chemical agent 146 can form other chemical elements or compounds that control the rate and/or the manner of material removal from the microelectronic substrate 112.

Figure 3:
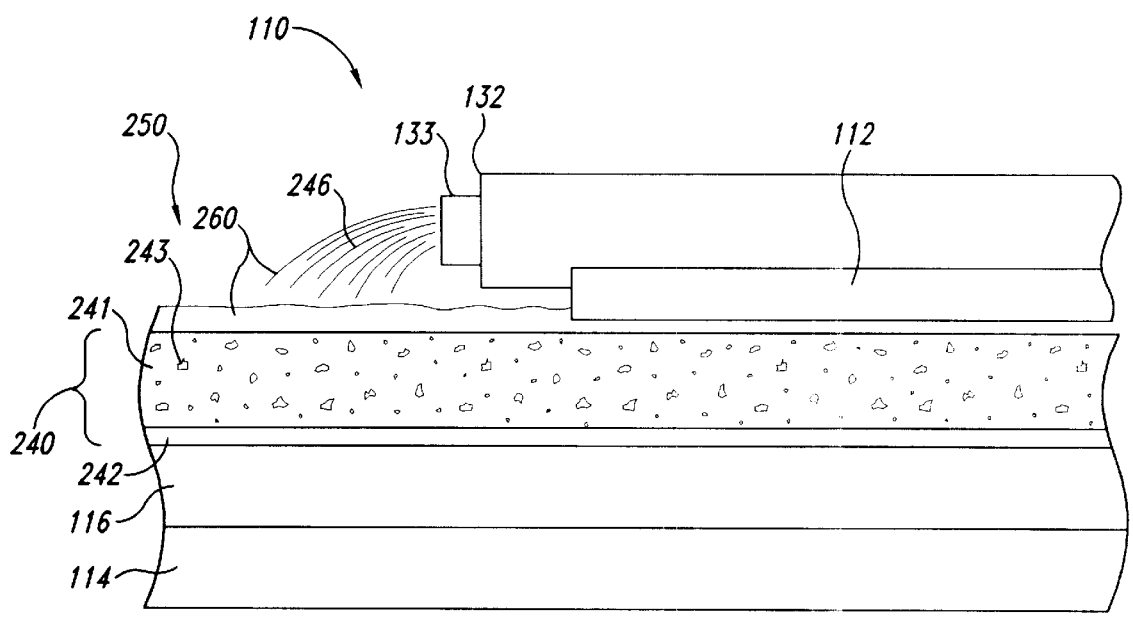
FIG. 3 is a schematic side cross-sectional view partially illustrating a planarizing pad supporting a planarizing liquid that includes a reactive chemical agent.

FIG. 3 is a schematic side elevational view partially illustrating the planarizing machine 110 discussed above with reference to FIG. 2 supporting a planarizing medium 250 that includes a planarizing pad 240 and a planarizing liquid 260 in accordance with another embodiment of the invention. The planarizing pad 240 can include a backing layer 242 that supports a planarizing pad body 241 having a plurality of abrasive elements 243. The planarizing pad 240 does not include an embedded chemical agent; instead, a chemical agent 246 is disposed directly in the planarizing liquid 260.

In one aspect of this embodiment, the chemical agent 246 directly restricts chemical interactions between the inhibiting agent and the abrasive particles 243 without first undergoing a chemical reaction with the planarizing liquid 260. Alternatively, the chemical agent 246 can first react with the planarizing liquid 260 to form an altered chemical agent that restricts interactions between the inhibiting agent and the abrasive particles 243, in a manner generally similar to that discussed above with reference to FIG. 2.

One feature of an embodiment of the planarizing medium 250 discussed above with reference to FIG. 3 is that the chemical agent 246 can be disposed directly in the planarizing liquid 260. Accordingly, the amount of chemical agent 246 in contact with the planarizing pad 240 and the microelectronic substrate 112 can be controlled by controlling the amount of chemical agent 246 mixed in the planarizing liquid 260. An advantage of this feature is that the amount of the chemical agent interacting with the planarizing pad 140 can be controlled independently from the characteristics of the planarizing pad 140.

In still another embodiment, the attractive forces between the abrasive elements 143 (FIG. 2) and components of the planarizing liquid 160 (such as the corrosion-inhibiting agent) can be controlled by controlling an electrical potential or charge on the abrasive elements 143. For example, the abrasive elements 143 can have an isoelectric point corresponding to the concentration of potential-determining ions at which the zeta potential (described above with reference to FIG. 2) is zero. The isoelectric point of the abrasive elements 143 also corresponds to the PH of the environment adjacent to the abrasive elements 143 at which the abrasive elements 143 have zero electric charge. The isoelectric point of the abrasive elements 143 is believed to relate to the pH of the planarizing liquid 160 (which is also a measure of ion concentration) in the following manner. If the isoelectric point of the abrasive element 143 is less than or equal to the pH of the planarizing liquid 160, attractive forces between the abrasive elements 143 and components of the planarizing liquid 160 (including the corrosion inhibiting agent) are reduced or eliminated. Conversely, if the isoelectric point of the abrasive elements 143 is above the pH of the planarizing liquid 160, the attractive forces between the abrasive elements 143 and components of the planarizing liquid 160 increase. Accordingly, in one aspect of this embodiment, the abrasive elements 143 are selected to have an isoelectric point that is less than or equal to the pH of the planarizing liquid 160 to which the abrasive elements 143 are exposed during planarization.

In one embodiment, the abrasive elements 143 can be formed from a single constituent (such as a single chemical element or a single chemical compound) that has an isoelectric point below the pH of the planarizing liquid 160. For example, the abrasive elements 143 can be formed from silica, which has an isoelectric point of two, for use with a planarizing solution having a pH greater than two. Accordingly, such abrasive elements 143 are suitable for, inter alia, certain types of copper CMP for which the planarizing liquid 160 has a pH of from about four to about five.

Alternatively, the abrasive elements 143 can be formed from a plurality of constituents. For example, the abrasive elements 143 can include both silica (having an isoelectric point of two) and alumina (which has an isoelectric point of nine) in a ratio that results in an aggregate isoelectric point equal to or less than the pH of the planarizing liquid 160. An advantage of the single constituent abrasive element 143 is that it can be relatively simple to manufacture. Conversely, an advantage of the multiple constituent abrasive element 143 is that it can combine desirable properties of each constituent. For example, in an alumina/silica abrasive element 143, the alumina, which is relatively hard, can provide mechanical support for the silica, which is relatively soft and might otherwise deform during planarization and/or detach from the planarizing pad.

Figures 5A, 5B:
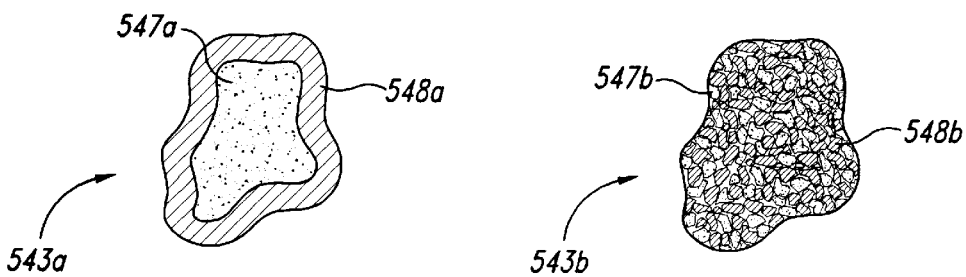
FIGS. 5A–5C are partially schematic, side cross-sectional views of abrasive elements in accordance with three embodiments of the invention.

FIG. 5A is a cross-sectional view of a coated abrasive element 543a in accordance with an embodiment of the invention. The coated abrasive element 543a can include an inner constituent 547a and an outer constituent 548a that completely or partially surrounds the inner constituent 547a. For example, the inner constituent 547a can include a relatively hard material (such as alumina) that supports the outer constituent 548a. The outer constituent 548a can include a softer material (such as silica) having an isoelectric point low enough to result in an aggregate isoelectric point of the abrasive element 543a that is less than or equal to the pH of the planarizing liquid 160 (FIG. 2).

In other embodiments, the inner and outer constituents 547a, 548a can have other chemical makeups. For example, the outer constituent 548a can include ceria and/or titania. Alternatively, the constituents 547a, 548a can include other elements or compounds, so long as the resulting abrasive element 543a has an aggregate isoelectric point at or below the pH of the planarizing liquid 160, and has sufficient strength and abrasive qualities to be suitable for use in a planarizing operation. In still another embodiment, the abrasive element 543a can include an inner constituent 547a partially or completely surrounded by an outer constituent 548a selected without regard for the resulting aggregate isoelectric point. Such abrasive elements can be suitable for planarizing environments in which the aggregate isoelectric point of the planarizing elements need not be controlled, for example, when the planarizing liquid does not contain corrosion inhibiting agents.

FIG. 5B is a cross-sectional view of a conglomerate abrasive element 543b that includes a first constituent 547b approximately evenly mixed with a second constituent 548b. The two constituents 547b, 548b can be selected to have an aggregate isoelectric point that is at or below the pH of the planarizing liquid 160, as described above. Accordingly, the first constituent 547b can include alumina or another suitable material, and the second constituent 548b can include silica, ceria and/or titania, or other suitable materials.

Figure 5C:
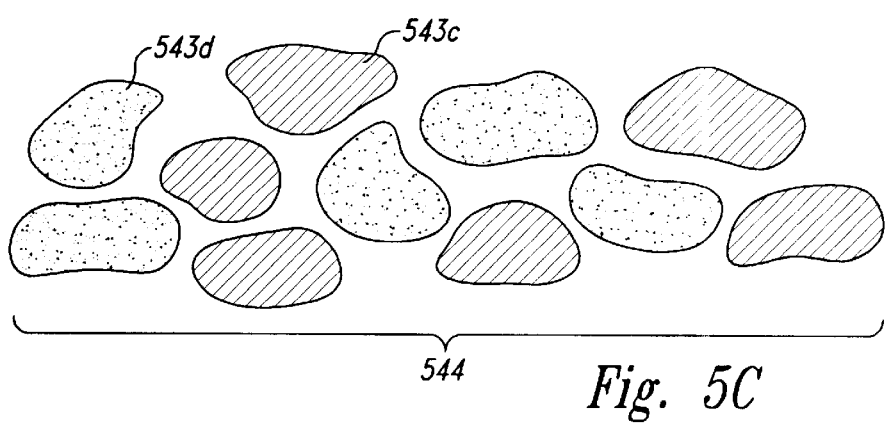

FIG. 5C is a cross-sectional view of an abrasive element group 544 having abrasive elements with different compositions distributed in close proximity to each other to produce an aggregate isoelectric point that is at or below the pH of the planarizing liquid 160 in accordance with another embodiment of the invention. For example, the group 544 can include first abrasive elements 543c having a first isoelectric point and second abrasive elements 543d having a second isoelectric point different than the first isoelectric point. In one aspect of this embodiment, the abrasive elements 543c, 543d can be positioned relatively closely together in a large group 544 that is distributed uniformly in the planarizing pad 140 (FIG. 2). Alternatively, the abrasive elements 543c, 543d can be arranged in smaller groups 544 that are spaced apart from each other in the planarizing pad 140. In still another alternate embodiment, the abrasive elements 543c, 543d (or other abrasive elements or groups of abrasive elements) can be selected to have different isoelectric points, and can be arranged in the planarizing pad 140 so that different regions of the planarizing pad 140 have different affinities for the inhibiting agent at a selected pH.

In other embodiments, the abrasive elements 543c, 543d can have other arrangements for which the effect of the second abrasive elements 543d is to change the aggregate isoelectric point of the group 544 from the value it would have if it were composed entirely of first abrasive elements 543c. Accordingly, the aggregate isoelectric point of the group 544 can be selected to be at or below the pH of the planarizing liquid 160.

Alternatively, when the second abrasive elements 543d include constituents (such as silica) having a low affinity for the inhibiting agent, the concentration of the second abrasive elements 543d can be great enough relative to the concentration of the first abrasive elements 543c (such as alumina) that the second abrasive elements 543d continue to remove material from the microelectronic substrate 112 (FIG. 2) even after the first abrasive elements 543c have adsorbed the corrosion inhibiting agent, regardless of the spacing between the first abrasive elements 543c and the second abrasive elements 543d. Accordingly, the second abrasive elements 543d may act as "backups" to the first abrasive elements 543c.

As described above, the isoelectric point of the abrasive element(s) can be selected to be less than a value of from about four to about five when the abrasive elements are used to planarize copper. In other embodiments, the isoelectric point of the abrasive element(s) can have other values. For example, the isoelectric point can have values higher than five when the abrasive elements are used for planarizing oxides, which is generally accomplished with a planarizing liquid having a pH of greater than five.

In any of the embodiments described above with reference to FIGS. 5A–5C, the overall or aggregate isoelectric point of an abrasive element or collection of abrasive elements can be controlled by combining constituents having different isoelectric points and/or different zeta potentials. Accordingly, the aggregate isoelectric point can be controlled to be less than or equal to the pH of the planarizing liquid 160. An advantage of this arrangement is that the abrasive elements will be less likely to adsorb or otherwise combine with components (such as corrosion inhibiting agents or other passivating agents) in the planarizing liquid that can reduce or eliminate the planarizing effectiveness of the abrasive elements.

Figure 6:
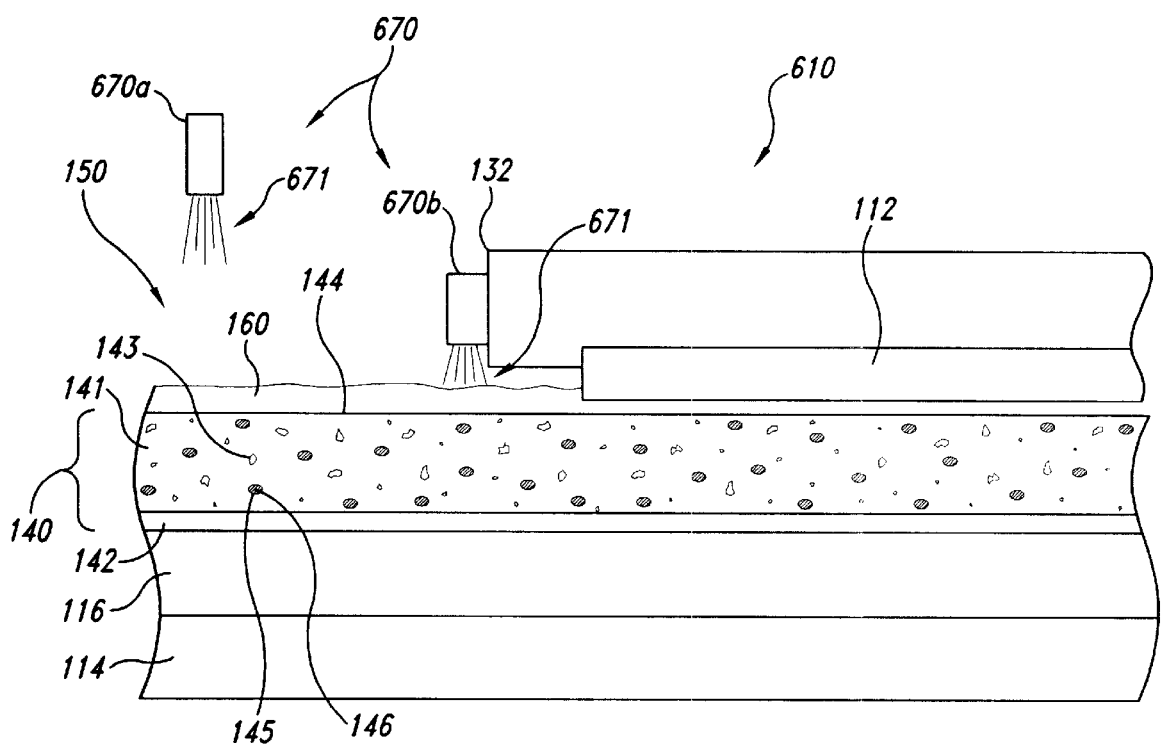
FIG. 6 is a partially schematic, side cross-sectional view of a planarizing apparatus having a high-frequency radiation source in accordance with another embodiment of the invention.

FIG. 6 is a partially schematic side elevational view of a planarizing machine 610 having one or more radiation sources 670 in accordance with another embodiment of the invention. In one aspect of this embodiment, the planarizing machine 610 can include an overhead radiation source 670a positioned above the planarizing pad 140 to direct radiation 671 downwardly onto the planarizing surface 144. Alternatively, the machine 610 can include an integrated radiation source 670b in addition to or in lieu of the overhead radiation source 670a. The integrated radiation source 670b can be positioned in the substrate holder or carrier 132 to direct the radiation 671 downwardly onto the planarizing pad 140. The carrier 132 can also include ports (not visible in FIG. 6) for disposing the planarizing liquid 160 onto the planarizing pad 140. Alternatively, the planarizing liquid 160 can be dispensed from another point proximate to the planarizing pad 140.

In either of the embodiments described above with reference to FIG. 6, the radiation sources 670 can emit radiation 671 that controls an amount of the corrosion inhibiting agent or other passivating agent adsorbed onto the abrasive elements 143. For example, in one embodiment, the radiation 671 can include ultraviolet radiation and in a specific aspect of this embodiment, the radiation 671 can have a wavelength of from about 100 nanometers to about 350 nanometers. In other embodiments, the radiation 671 can have other wavelengths, so long as the radiation 671 can control an amount of corrosion inhibiting agent adsorbed by the abrasive elements 143. For example, in one aspect of this embodiment, the radiation 671 absorbed by the abrasive elements 143 can increase the vibrational energy of the molecules forming the abrasive elements 143 to the point that the corrosion inhibiting agent separates from the abrasive elements 143. Alternatively, the energy absorbed by the abrasive elements 143 can prevent or at least restrict adsorption of the corrosion-inhibiting agent.

The radiation can be directed to a planarizing pad 140 having cells 145 with a chemical agent 146, as shown in FIG. 6 and described above with reference to FIG. 2, or alternatively, the planarizing pad 140 can have no cells 145, or can have other features (such as low isoelectric point abrasive elements 143) that reduce the affinity between the abrasive elements 143 and the corrosion inhibiting agent. In any of these embodiments, an advantage of the ultraviolet radiation 671 is that the amount of corrosion inhibiting agent adsorbed by the abrasive elements 143 can be reduced when compared to conventional arrangements. Accordingly, the abrasive elements 143 can more effectively planarize the substrate 112.

Figure 4:
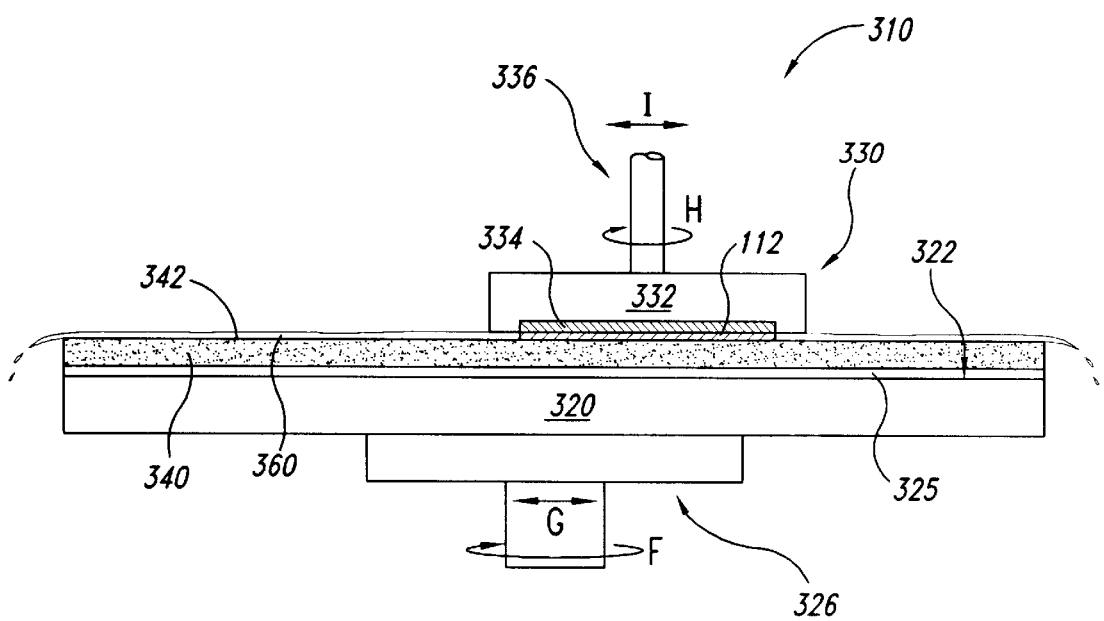
FIG. 4 is a partially schematic side cross-sectional view of a planarizing pad that supports a planarizing liquid on a CMP machine in accordance with another embodiment of the invention.

FIG. 4 is a partially schematic cross-sectional view of a rotary planarizing machine 310 with a generally circular platen or table 320, a carrier assembly 330, a planarizing pad 340 positioned on the table 320, and a planarizing liquid 360 on the planarizing pad 340. The compositions of planarizing pad 340 and the planarizing liquid 360 can be generally similar to the compositions of planarizing pads and planarizing liquids described above with reference to FIGS. 2–6. Alternatively, the planarizing liquid 360 can be a slurry having a suspension of abrasive elements, and the planarizing pad 340 can have no abrasive elements. The planarizing machine 310 may also have an under-pad 325 attached to an upper surface 322 of the platen 320 for supporting the planarizing pad 340. A drive assembly 326 rotates (arrow "F") and/or reciprocates (arrow "G") the platen 320 to move the planarizing pad 340 during planarization.

The carrier assembly 330 controls and protects the microelectronic substrate 112 during planarization. The carrier assembly 330 typically has a substrate holder 332 with a pad 334 that holds the microelectronic substrate 112 via suction. A drive assembly 336 of the carrier assembly 330 typically rotates and/or translates the substrate holder 332 (arrows "H" and "I," respectively). Alternatively, the substrate holder 332 may include a weighted, free-floating disk (not shown) that slides over the planarizing pad 340.

To planarize the microelectronic substrate 112 with the planarizing machine 310, the carrier assembly 330 presses the microelectronic substrate 112 against a planarizing surface 342 of the planarizing pad 340. The platen 320 and/or the substrate holder 332 then move relative to one another to translate the microelectronic substrate 112 across the planarizing surface 342. As a result, the abrasive particles in the planarizing pad 340 and/or the chemicals in the planarizing liquid 360 remove material from the surface of the microelectronic substrate 112.

From the foregoing, it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for planarizing a microelectronic substrate, comprising:

engaging the microelectronic substrate with a planarizing medium that includes a planarizing pad having a planarizing surface and abrasive elements fixedly positioned at least proximate to the planarizing surface, the planarizing medium further including a planarizing liquid;

controlling an isoelectric point of at least a portion of the planarizing pad to be approximately equal to or less than a pH of the planarizing liquid; and moving at least one of the planarizing pad and the microelectronic substrate relative to the other to remove material from the microelectronic substrate.

2. The method of claim 1 wherein the abrasive elements include a first constituent having an isoelectric point with a first value greater than the pH of the planarizing liquid prior to engaging the microelectronic substrate with the planarizing medium, and wherein the method further comprises reducing the isoelectric point to a second value less than the first value by adding a second constituent to the first constituent before engaging the microelectronic substrate with the planarizing medium.

3. The method of claim 1 wherein the planarizing liquid includes a passivating agent, further comprising controlling a rate at which the passivating agent adsorbs to the abrasive elements by directing ultraviolet radiation toward the abrasive elements, the inhibiting agent or both.

4. The method of claim 1, further comprising selecting the pH of the planarizing liquid to be from approximately four to approximately five.

5. The method of claim 1, further comprising controlling a zeta potential of the abrasive elements.

6. The method of claim 1 wherein the planarizing medium includes a passivating agent, and wherein the method further comprises controlling an affinity of the abrasive elements for the passivating agent.

7. The method of claim 1 wherein the planarizing medium includes a corrosion inhibiting agent, and wherein the method further comprises controlling an affinity of the abrasive elements for the corrosion inhibiting agent.

8. The method of claim 1 wherein controlling the isoelectric point of at least a portion of the planarizing pad includes controlling an isoelectric point of the abrasive elements.

9. The method of claim 1 wherein controlling the isoelectric point of at least a portion of the planarizing pad includes selecting a first abrasive element constituent having a first isoelectric point, selecting a second abrasive element constituent having a second isoelectric point different than the first isoelectric point, and combining the first and second abrasive element constituents.

10. The method of claim 1, further comprising selecting the abrasive elements to have an electrical potential with a first value and controlling an affinity of the abrasive elements for a corrosion inhibiting agent in the planarizing liquid by changing the electrical potential of the abrasive elements to a second value.

11. The method of claim 1 wherein removing material from the microelectronic substrate includes removing metal material.

12. A method for planarizing a microelectronic substrate, comprising:

engaging the microelectronic substrate with a planarizing medium that includes a planarizing pad having a planarizing surface and abrasive elements fixedly positioned at least proximate to the planarizing surface, the planarizing medium further including a planarizing liquid;

moving at least one of the planarizing pad and the microelectronic substrate relative to the other to remove material from the microelectronic substrate; and restricting a passivating agent from adsorbing to the abrasive elements, separating the passivating agent from the abrasive elements or both restricting a passivating agent from adsorbing to the abrasive elements and separating the passivating agent from the abrasive elements.

13. The method of claim 12 wherein restricting the passivating agent and/or separating the passivating agent includes directing electromagnetic radiation toward the planarizing medium.

14. The method of claim 12 wherein restricting the passivating agent and/or separating the passivating agent includes directing toward the planarizing medium electromagnetic radiation having a wavelength of from about 100 nm to about 350 nm.

15. The method of claim 12 wherein restricting the passivating agent and/or separating the passivating agent includes controlling an isoelectric point of the abrasive elements to be approximately equal to or less than a pH of the planarizing liquid.

16. The method of claim 12 wherein the abrasive elements include a first constituent having an isoelectric point with a first value greater than a pH of the planarizing liquid prior to engaging the microelectronic substrate with the planarizing medium, and wherein the method further comprises reducing the isoelectric point to a second value less than the first value by adding a second constituent to the planarizing pad before engaging the microelectronic substrate with the planarizing medium.

17. A method for forming a planarizing pad for planarizing microelectronic substrates with a planarizing medium having a selected pH, comprising:

providing a plurality of abrasive elements having an aggregate isoelectric point relative to the selected pH to inhibit affinity between the abrasive elements and a component of the planarizing medium; and fixedly distributing the plurality of abrasive elements in a suspension medium of the planarizing pad, with at least some of the abrasive elements positioned proximate to a planarizing surface of the planarizing pad.

18. The method of claim 17 wherein the selected pH is from approximately four to approximately five and the abrasive elements have an aggregate isoelectric point less than the selected pH.

19. The method of claim 17 wherein providing the abrasive elements includes providing abrasive elements having an aggregate isoelectric point less than or equal to the selected pH.

20. The method of claim 17, further comprising combining a first abrasive element constituent having a first isoelectric point with a second abrasive element constituent having a second isoelectric point different than the first isoelectric point.

21. A method for planarizing a microelectronic substrate, comprising:

disposing a planarizing liquid on a planarizing surface of a planarizing pad having a plurality of abrasive elements fixedly positioned at least proximate to the planarizing surface;

engaging the microelectronic substrate with the planarizing surface of the planarizing pad; and controlling a pH of the planarizing liquid, controlling an isoelectric point of the abrasive elements, or controlling both the pH and the isoelectric point to maintain the pH of the planarizing liquid at or above the isoelectric point of the abrasive elements while at least one of the microelectronic substrate and the planarizing pad moves relative to the other.

22. The method of claim 21 wherein the planarizing liquid includes a corrosion inhibitor and wherein the method further comprises controlling an affinity between the corrosion inhibitor and the abrasive elements.

23. The method of claim 21 wherein the planarizing liquid includes benzoltriazole, and wherein the method further comprises controlling an affinity between the benzoltriazole and the abrasive elements.

24. The method of claim 21 wherein controlling the pH includes controlling the pH to be from approximately four to approximately five.

25. The method of claim 21, further comprising selecting the abrasive elements to include a first constituent having a first isoelectric point and a second constituent having a second isoelectric point different than the first isoelectric point.

26. A method for forming a planarizing pad for removing material from a microelectronic substrate, comprising:

selecting an abrasive element having an electrical potential with a first value;

changing the electrical potential of the abrasive element to a second value according to an affinity of the abrasive element for a corrosion inhibiting agent; and fixedly positioning the abrasive element in a planarizing pad at least proximate to a planarizing surface of the planarizing pad.

27. The method of claim 26 wherein selecting an abrasive element includes selecting an alumina element.

28. The method of claim 26 wherein the abrasive element includes a first constituent and changing the electrical potential of the abrasive element includes coating the first constituent with a second constituent.

29. The method of claim 26 wherein the abrasive element includes alumina and changing the electrical potential of the abrasive element includes at least partially encapsulating the alumina with a coating that includes silica, ceria, and/or titania.

30. The method of claim 26, further comprising mixing a first abrasive element constituent with a second abrasive element constituent.

31. A method for forming a planarizing pad for removing material from a microelectronic substrate, comprising:

selecting an abrasive element having an isoelectric point with a first value;

changing the isoelectric point of the abrasive element to a second value; and fixedly disposing the abrasive element in a planarizing pad at least proximate to a planarizing surface of the planarizing pad.

32. The method of claim 31 wherein the abrasive element includes a first constituent and changing the electrical potential of the abrasive element includes at least partially coating the first constituent with a second constituent.

33. The method of claim 31, further comprising mixing a first abrasive element constituent having a first isoelectric point with a second abrasive element constituent having a second isoelectric point different than the first isoelectric point.

34. The method of claim 31, further comprising:
selecting the abrasive element to have a zeta potential with a first value when the abrasive element is positioned adjacent to a planarizing liquid having a corrosion inhibiting agent and a selected pH and at least one of the abrasive element and the planarizing liquid is moved relative to the other; and
changing the zeta potential of the abrasive element until the abrasive element has a second value different than the first value.

35. A method for forming a planarizing pad for removing material from a microelectronic substrate, comprising:
at least partially coating a plurality of alumina particles with a material having an isoelectric point less than an isoelectric point of the alumina particles; and
fixedly dispersing the coated alumina particles in a solid suspension medium with at least some of the coated alumina particles positioned proximate to an external surface of the suspension medium to contact the microelectronic substrate when the microelectronic substrate engages the suspension medium and at least one of the microelectronic substrate and the suspension medium is moved relative to the other.

36. The method of claim 35, further comprising selecting the material coating the alumina particles to include at least one of silica, ceria, and titania.

37. The method of claim 35, further comprising selecting the material coating the alumina particles have an isoelectric point less than an isoelectric point of the alumina with an isoelectric point of the coated alumina particles being less than a selected pH within a pH range of from about four to about five.

38. The method of claim 35, further comprising:
selecting a pH range for a planarizing environment in which the planarizing pad is intended to be used; and
selecting an isoelectric point of the coated alumina particles to be less than a selected value in the pH range.

39. A method for forming a planarizing pad for removing material from a microelectronic substrate with a planarizing medium having a selected pH, comprising:
fixedly disposing first abrasive elements having a first chemical composition and a first isoelectric point in a suspension medium with at least some of the first abrasive elements positioned proximate to an external surface of the suspension medium; and
fixedly distributing second abrasive elements in the suspension medium, the second abrasive elements having a second chemical composition different than the first chemical composition and a second isoelectric point different than the first isoelectric point with at least some of the second abrasive elements positioned proximate to the external surface of the suspension medium, at least one of the first and second chemical compositions being selected to inhibit an affinity between the planarizing pad and a component of the planarizing medium at the selected pH.

40. The method of claim 39, further comprising selecting the first abrasive elements to include alumina.

41. The method of claim 39, further comprising selecting the second abrasive elements to include at least one of silica, ceria, and titania.

42. The method of claim 39, further comprising selecting a concentration of the second abrasive elements to be high enough relative to a concentration of the first abrasive elements that the second abrasive elements continue to remove material from the microelectronic substrate after the first abrasive elements have adsorbed a passivating agent during planarization.

43. A method for removing material from a microelectronic substrate, comprising:
engaging the microelectronic substrate with a planarizing medium that includes a planarizing pad having abrasive elements fixedly disposed therein and a planarizing liquid disposed on the planarizing pad, the planarizing liquid having a passivating agent;
moving at least one of the planarizing pad and the microelectronic substrate relative to the other to remove material from the microelectronic substrate; and
controlling an amount of the passivating agent adsorbed to the abrasive elements by directing electromagnetic radiation toward the planarizing medium.

44. The method of claim 43 wherein controlling an amount of passivating agent adsorbed to the abrasive elements includes removing at least a portion of the passivating agent from the abrasive elements.

45. The method of claim 43 wherein the passivating agent includes a corrosion inhibiting agent, and wherein directing electromagnetic radiation toward the planarizing medium includes directing ultraviolet radiation toward the abrasive elements.

46. The method of claim 43 wherein directing electromagnetic radiation toward the planarizing medium includes directing radiation having a wavelength of from about 100 nm to about 350 nm.

47. The method of claim 43 wherein at least a portion of the passivating agent is initially adsorbed to the abrasive elements and controlling the amount of passivating agent adsorbed to the abrasive elements includes removing at least some of the passivating agent from the abrasive elements.

48. The method of claim 43, further comprising directing the electromagnetic radiation from a carrier supporting the microelectronic substrate.

49. The method of claim 43, further comprising directing the electromagnetic radiation toward the planarizing medium from an electromagnetic radiation source spaced apart from the planarizing medium.

50. A method for removing material from a microelectronic substrate, comprising:
engaging the microelectronic substrate with a planarizing medium that includes a planarizing pad having abrasive elements fixedly disposed therein and a planarizing liquid disposed on the polishing pad, the planarizing liquid having a corrosion inhibiting agent;
moving at least one of the planarizing pad and the microelectronic substrate relative to the other to remove material from the microelectronic substrate; and
removing a portion of the corrosion-inhibiting agent adsorbed to the abrasive elements by directing ultraviolet radiation toward the abrasive elements.

51. The method of claim 50, further comprising selecting the abrasive elements to include alumina and selecting the corrosion inhibiting agent to include benzoltriazole.

52. The method of claim 50, further comprising directing the ultraviolet radiation toward the abrasive elements from a carrier that supports the microelectronic substrate relative to the planarizing medium.

53. An apparatus for removing material from a microelectronic substrate, comprising:
- a platen having a generally flat support surface;
- a planarizing pad supported on the platen and having a planarizing surface configured to support a planarizing liquid;
- a plurality of abrasive elements fixedly positioned in the planarizing pad at least proximate to the planarizing surface and having an aggregate isoelectric point selected to be less than a pH of the planarizing liquid; and
- a carrier configured to engage a microelectronic substrate and support the microelectronic substrate adjacent to the planarizing pad, at least one of the platen and the carrier being movable relative to the other.

54. The apparatus of claim 53, further comprising the planarizing liquid wherein the planarizing liquid has a pH of from approximately four to approximately five.

55. The apparatus of claim 53 wherein the abrasive elements include a first constituent having a first isoelectric point and at least partially surrounded by a second constituent having a second isoelectric point.

56. The apparatus of claim 53 wherein the abrasive elements include first abrasive elements formed from a first constituent having a first isoelectric point and second abrasive elements at least proximate to the first abrasive elements and formed from a second constituent having a second isoelectric point different than the first isoelectric point.

57. The apparatus of claim 53 wherein the abrasive elements include alumina and at least one of silica, ceria and titania.

58. The apparatus of claim 53, further comprising a source of high-frequency electromagnetic radiation directed toward the planarizing pad.

59. A planarizing medium for removing material from a microelectronic substrate, comprising:
- a planarizing pad having a first surface and a second surface facing opposite the first surface; and
- a plurality of abrasive elements fixedly disposed in the planarizing pad at least proximate to the first surface, the abrasive elements including a first constituent having a first isoelectric point and a second constituent having a second isoelectric point different than the first isolectric point, the second constituent at least partially coating the first constituent.

60. The planarizing medium of claim 59 wherein the first constituent includes alumina and the second constituent has an isoelectric point less than an isoelectric point of alumina.

61. The planarizing medium of claim 59 wherein the first constituent includes alumina and the second constituent is selected from ceria, silica and/or titania.

62. A planarizing medium for removing material from a microelectronic substrate, comprising:
- a planarizing pad having a first surface and a second surface facing opposite the first surface; and
- a plurality of abrasive elements fixedly disposed in the planarizing pad at least proximate to the first surface, the abrasive elements including a first constituent having a first chemical composition and a second constituent having a second chemical composition different than the first chemical composition, the second constituent at least partially coating the first constituent.

63. The planarizing medium of claim 62 wherein the first constituent has a first isoelectric point, the second constituent has a second isoelectric point different than the first isoelectric point and the abrasive elements have an isoelectric point between the first and second isoelectric points.

64. The planarizing medium of claim 62 wherein the first constituent includes alumina and the second constituent includes at least one of silica, ceria and titania.

65. The planarizing medium of claim 62 wherein an isoelectric point of the abrasive elements is selected to be less than a pH of a planarizing liquid with which the planarizing pad is configured for use.

66. The planarizing medium of claim 62, further comprising a planarizing liquid adjacent to the planarizing surface of the planarizing pad, the planarizing liquid having a pH greater than an isoelectric point of the abrasive elements.

67. A planarizing medium for removing material from a microelectronic substrate, comprising:
- a planarizing pad having a planarizing surface;
- a plurality of abrasive elements fixedly dispersed in the planarizing pad at least proximate to the planarizing surface, the abrasive elements having an isoelectric point; and
- a planarizing liquid adjacent to the planarizing pad, the planarizing liquid having a pH greater than the isoelectric point of the abrasive elements.

68. The planarizing medium of claim 67 wherein the planarizing liquid has a pH of from approximately four to approximately five.

69. The planarizing medium of claim 67 wherein the abrasive elements include a first constituent having a first isoelectric point and a second constituent having a second isoelectric point different than the first isoelectric point.

70. The planarizing medium of claim 67 wherein the abrasive elements include first abrasive particles having a first isoelectric point and second abrasive particles having a second isoelectric point different than the first isoelectric point.

71. A planarizing medium for removing material from a microelectronic substrate, comprising:
- a planarizing pad having a planarizing surface; and
- a plurality of abrasive elements fixedly dispersed in the planarizing pad at least proximate to the planarizing surface, the abrasive elements including a first constituent with a first zeta potential and a first isoelectric point, the abrasive elements further including a second constituent with a second zeta potential and a second isoelectric point, an overall isoelectric point of the abrasive elements being between the first and second isoelectric points.

72. The planarizing medium of claim 71, further comprising a planarizing liquid adjacent to the planarizing pad, the planarizing liquid having a pH greater than the overall isoelectric point of the abrasive elements.

73. The planarizing medium of claim 71 wherein the second constituent forms a coating at least partially surrounding the first constituent.

74. The planarizing medium of claim 71 wherein the second constituent forms a coating at least partially surrounding the first constituent, and the second constituent is softer than the first constituent.

75. The planarizing medium of claim 71 wherein the first constituent includes alumina and the second constituent includes silica, ceria and/or titania.

76. The planarizing medium of claim 71 wherein the abrasive elements include particles of the first consituent bound directly to particles of the second constituent.

77. A planarizing medium for removing material from a microelectronic substrate, comprising:

a planarizing pad having a planarizing surface;

a plurality of first abrasive elements fixedly dispersed in the planarizing pad at least proximate to the planarizing surface, the first abrasive elements having a first zeta potential and a first isoelectric point; and a plurality of second abrasive elements fixedly dispersed in the planarizing pad at least proximate to the planarizing surface, the second abrasive elements having a second zeta potential and a second isoelectric point, an aggregate isoelectric point of the first and second abrasive elements being between the first and second isoelectric points.

78. The planarizing medium of claim 77, further comprising a planarizing liquid adjacent to the planarizing pad, the planarizing liquid having a pH greater than the overall isoelectric point of the abrasive elements.

79. The planarizing medium of claim 77 wherein the first constituent includes alumina and the second constituent includes at least one silica, ceria and titania.

80. An apparatus for removing material from a microelectronic substrate, comprising:

a platen having a generally flat support surface;

a planarizing medium supported by the platen, the planarizing medium including a planarizing pad having a planarizing surface configured to support a planarizing liquid;

a plurality of abrasive elements fixedly positioned in the planarizing pad at least proximate to the planarizing surface;

a carrier configured to engage a microelectronic substrate and support the microelectronic substrate adjacent to the planarizing pad, at least one of the platen and the carrier being movable relative to the other; and a high-frequency electromagnetic energy source operatively coupled to the planarizing medium to impart high frequency radiation to the planarizing medium.

81. The apparatus of claim 80 wherein the electromagnetic energy source includes an ultraviolet radiation source.

82. The apparatus of claim 80 wherein the electromagnetic energy source includes a source of radiation having a wavelength of from about 100 nm to about 350 nm.

83. The apparatus of claim 80 wherein the electromagnetic energy source is attached to the carrier.

84. The apparatus of claim 80 wherein the electromagnetic energy source is positioned above the planarizing medium to direct the electromagnetic energy downwardly toward the planarizing medium.

* * * * *

UNITED STATES PATENT AND TRADEMARK OFFICE
CERTIFICATE OF CORRECTION

PATENT NO. : 6,548,407 B1
DATED : April 15, 2003
INVENTOR(S) : Chopra et al.

It is certified that error appears in the above-identified patent and that said Letters Patent is hereby corrected as shown below:

Title page,
Item [57], ABSTRACT, line 13, "planaring" should be -- planarizing --;

Column 7,
Line 3, delete "is" between "agent" and "typically";

Column 13,
Line 47, add -- an -- between "inhibit" and "affinity";

Column 18,
Line 64, "consituent" should be -- constituent --;

Signed and Sealed this

Twenty-ninth Day of July, 2003

JAMES E. ROGAN
*Director of the United States Patent and Trademark Office*